(12) United States Patent
Yong et al.

(10) Patent No.: US 10,108,227 B2
(45) Date of Patent: Oct. 23, 2018

(54) TECHNIQUES FOR PROVIDING AN INTERFACE COMPONENT FOR A WEARABLE DEVICE

(71) Applicant: INTEL CORPORATION, Santa Clara, CA (US)

(72) Inventors: Khang Choong Yong, Puchong (MY); Shu Young Cheah, Byan Lepas (MY); Wil Choon Song, Bayan Lepas (MY); Jackson Chung Peng Kong, Tanjung Tokong (MY); Howard Heck, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 169 days.

(21) Appl. No.: 14/998,067

(22) Filed: Dec. 24, 2015

(65) Prior Publication Data
US 2017/0185102 A1   Jun. 29, 2017

(51) Int. Cl.
| H01R 24/00 | (2011.01) |
| G06F 1/16 | (2006.01) |
| H01R 12/70 | (2011.01) |
| H01R 12/71 | (2011.01) |
| H05K 1/11 | (2006.01) |
| A41D 1/00 | (2018.01) |
| H01R 4/58 | (2006.01) |

(52) U.S. Cl.
CPC ............ *G06F 1/163* (2013.01); *G06F 1/1656* (2013.01); *H01R 12/7011* (2013.01); *H01R 12/718* (2013.01); *H05K 1/11* (2013.01); *A41D 1/005* (2013.01); *H01R 4/58* (2013.01)

(58) Field of Classification Search
None
See application file for complete search history.

(56) References Cited

U.S. PATENT DOCUMENTS

| 6,319,015 | B1* | 11/2001 | Faunce | H01R 11/22 |
| | | | | 24/662 |
| 7,753,685 | B2* | 7/2010 | Lee | H01R 12/592 |
| | | | | 439/37 |
| 8,465,328 | B2* | 6/2013 | Iida | H01R 4/58 |
| | | | | 439/660 |
| 9,577,374 | B1* | 2/2017 | Grant | H01R 4/58 |
| 2009/0149037 | A1 | 6/2009 | Lee et al. | |
| 2015/0127286 | A1 | 5/2015 | Capozzi et al. | |
| 2015/0296963 | A1 | 10/2015 | Byun et al. | |
| 2015/0317812 | A1 | 11/2015 | Louredo | |

(Continued)

OTHER PUBLICATIONS

International Search Report and Written Opinion received for PCT Patent Application No. PCT/US2016/063760, dated Mar. 17, 2017, 14 pages.

*Primary Examiner* — Tho D Ta

(57) ABSTRACT

Various embodiments are generally directed to an apparatus, method and other techniques to provide a interface component including a housing comprising a first shell portion and a second shell portion, the first shell portion forming an extended portion for the housing and comprising a retention track engageable a counterpart retention track. The interface component to include a printed circuit board disposed within the housing, the printed circuit board comprising a plurality of contact pins each comprising a contact hole and a retention bump and a socket to couple with a stud.

23 Claims, 11 Drawing Sheets

(56) References Cited

U.S. PATENT DOCUMENTS

2015/0365119 A1 12/2015 Shin et al.
2016/0073701 A1* 3/2016 Maloney ................ A41D 1/005
　　　　　　　　　　　　　　　　　　　　439/37

* cited by examiner

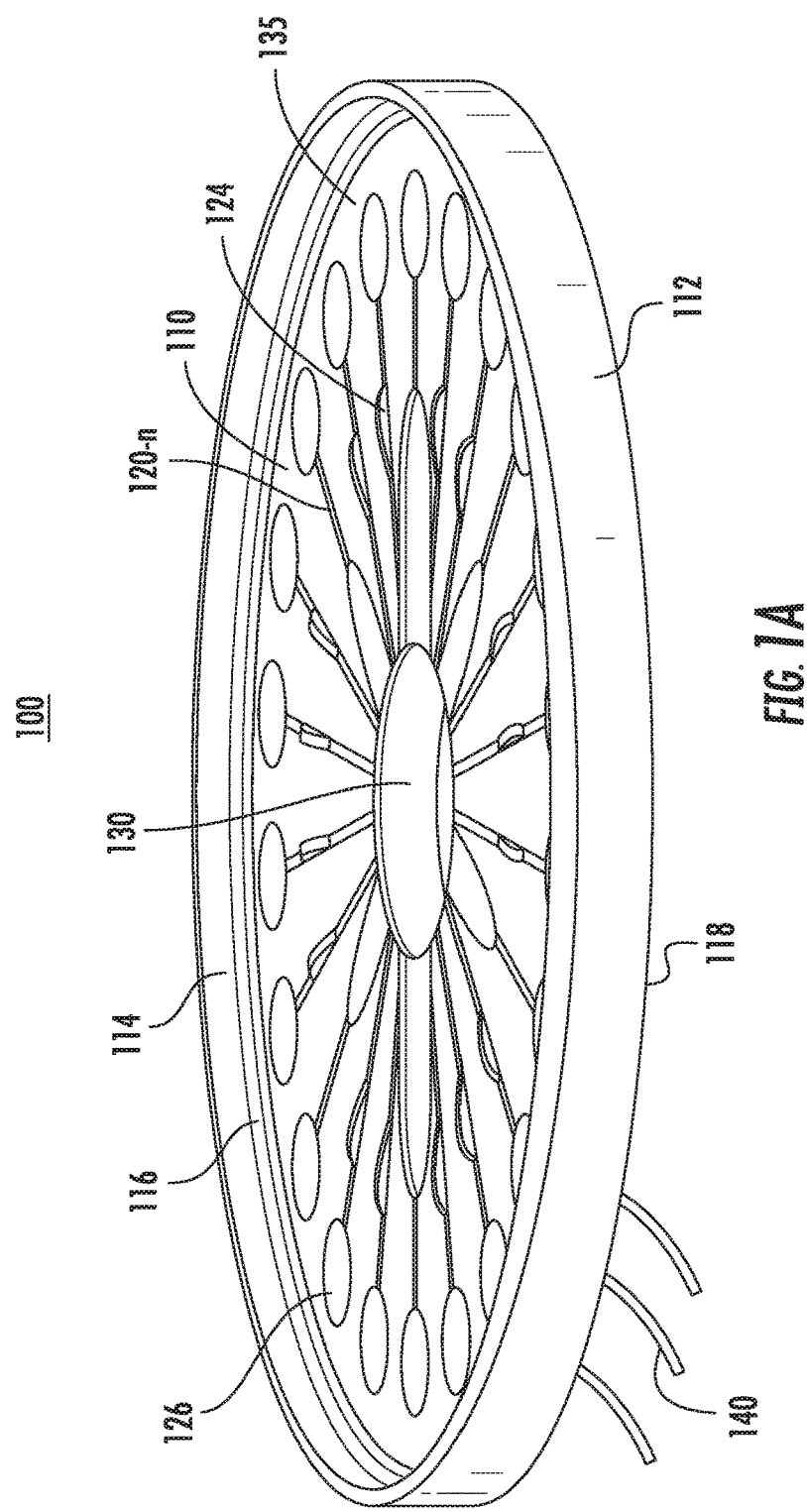

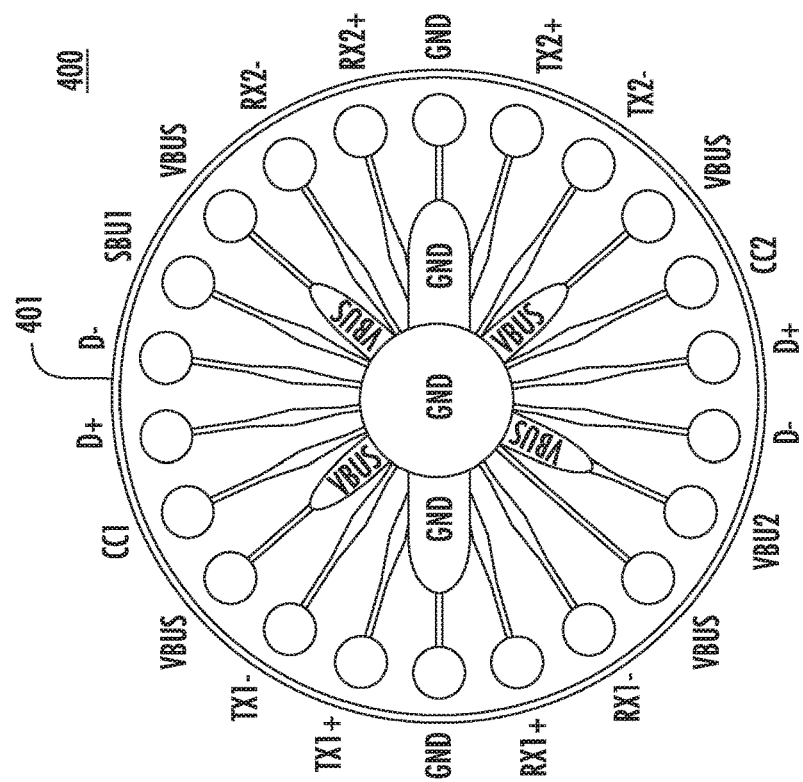

| GROUP | SIGNAL NAME | DESCRIPTION |
|---|---|---|
| POWER | VBUS | VBUS, CAPABLE OF UP TO 20V @5A WITH USB PD |
| GROUND | GND | GROUND |
| HIGH SPEED DIFFERENTIAL | TX1+ | FIRST HS DIFF TX PAIR |
| | TX1- | |
| | RX1+ | FIRST HS DIFF RX PAIR |
| | RX1- | |
| | TX2+ | SECOND HS DIFF TX PAIR |
| | TX2- | |
| | RX2+ | SECOND HS DIFF RX PAIR |
| | RX2- | |
| HIGH SPEED DIFFERENTIAL | D+ | LOW SPEED DIFFERENTIAL PAIR, PRIMARY FOR USB 2 CONNECTION |
| | D- | |
| CONTROL | CC1 | CONFIGURATION CHANNEL 1. USED FOR DEVICE DETECTION, ORIENTATION DETECTION AND ALTERNATE MODE CONFIGURATION. UNCONNECTED PINS WILL BE RECONFIGURED TO VCONN. |
| | CC2 | CONFIGURATION CHANNEL 2. USED FOR DEVICE DETECTION, ORIENTATION DETECTION AND ALTERNATE MODE CONFIGURATION. UNCONNECTED PINS WILL BE RECONFIGURED TO VCONN. |
| SIDE BAND | SBU1 | SIDEBAND USE SIGNALS. |
| | SBU2 | |

FIG. 4

TECHNIQUES FOR PROVIDING AN INTERFACE COMPONENT FOR A WEARABLE DEVICE

TECHNICAL FIELD

Embodiments described herein generally relate to techniques to enable input/output (I/O) communication of information utilizing an interface component for a wearable device.

BACKGROUND

Modern computing devices continue to evolve in variety of ways. One particular area in which computing devices have evolved is in the area of wearable computing devices that are becoming increasingly popular as stand-alone computing devices and as peripherals used in conjunction with other computing devices. Additionally, many modern computing devices include a plurality of devices and mechanisms enabling on-the-go or mobile functionality. The inclusion of an abundance of features has resulted in an increased reliance upon mobile computing devices for mobile computing tasks. These additional features and functionality require additional interface components while also remaining mobile.

BRIEF DESCRIPTION OF THE DRAWINGS

FIG. 4 illustrates an example of a pinout for a device.

DETAILED DESCRIPTION

Figure 1B:
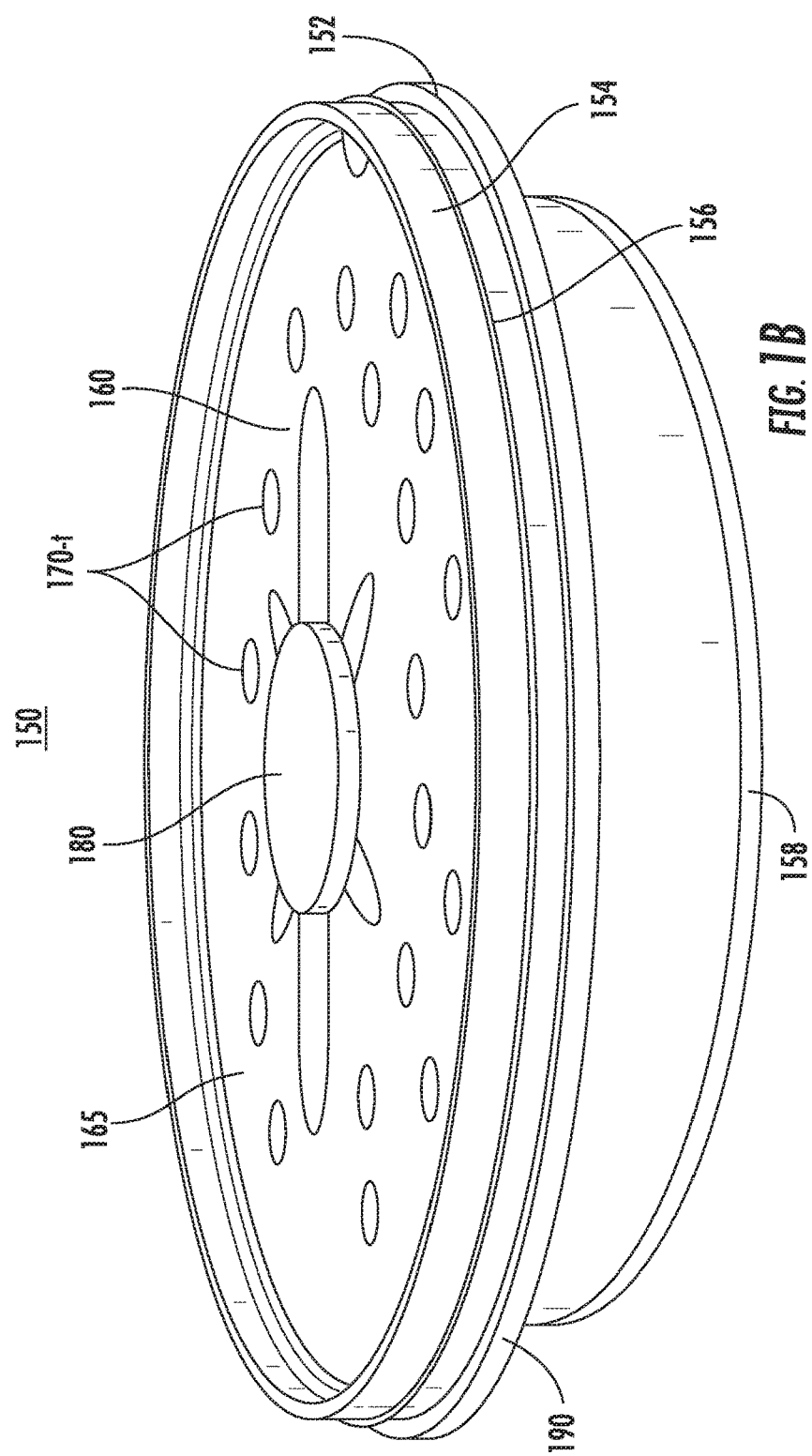
FIGS. 1A/1B illustrate an example first device.

Various embodiments are directed to systems, devices, methods and techniques for providing interface components to enable I/O communication for wearable devices. In some embodiments, the interface component may operate and be configured in accordance with one or more standards. For example, in some embodiments, the interface component may operate and be configured in accordance with the Universal Serial Bus (USB) 3.1 Specification, published on Jul. 26, 2013, or any variant thereof (hereinafter "USB Specification"). Further, some embodiments may be directed towards operation and configuration in accordance with the Universal Serial Bus Type-C Cable and Connector Specification, revision 1.1, published on Apr. 3, 2015, or any variant thereof (hereinafter "USB Type-C Specification"). However, some embodiments may make modification and improvements to one or more of the features discussed in the USB Specification and/or the USB Type-C Specification. Further, embodiments are not limited to these specific standards, concepts and features discussed herein apply to different types in interfaces, such as parallel interfaces. These and other details will become more apparent in the follow description.

In some embodiments, the interface component may take the shape or form of a wearable device itself, such as a button, a watch face, an activity tracker interface, an earring, a pendent, a belt buckle, eyeglasses, other jewelry, and so forth. The interface may be part of a system including devices and processing circuitry to process information and data. For example, the interface component may be coupled with a processor and a sensor and operate a fitness tracker. In another example, the interface component may be coupled with an input device and other interface components in a system on a smart blazer to perform compute functionality. In another example, the interface component may be part of a smart wristband and enable coupling with a plurality of modules to perform different functions, such as wireless communications, smart watch, and portable storage. In another example, the interface component may be part of a wearable device, such as an earring to enable communication and processing of information and data. These and other details will be discussed in more detail below.

Various embodiments also relate to an apparatus or systems for performing these operations. This apparatus may be specially constructed for the purpose or it may include a general-purpose computer as selectively activated or reconfigured by a computer program stored in the computer. The procedures presented herein are not inherently related to a particular computer or other apparatus. Various general-purpose machines may be used with programs written in accordance with the teachings herein, or it may prove convenient to construct more specialized apparatus to perform the method. The structure for a variety of these machines will appear from the description given.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives consistent with the claimed subject matter.

FIG. 1A illustrates an example device 100. In some embodiments, as shown in FIG. 1A, device 100 may be a female plug of an interface component capable of engaging a male plug of the interface component. The device 100 may include a number of features to enable I/O communication of information between systems and devices. For example, the device 100 may include a housing 110 that further includes an outer shell 112, inner shell 114, a retention track 116, and a base 118. The device 100 may include a printed circuit board (PCB) 135 which has a socket 130 and contact pins 120-$n$, where n may be any positive integer. In one example embodiment, PCB 135 may have 22 contact pins 120-1 through 120-22 and each contact pin may have a retention bump 124-$n$ and a contact hole 126-$n$. The device 100 may also include plurality of conducting threads 140-$m$, where m may be any positive integer. In some instances each conducting thread 140 may be coupled with a contact hole 126 of a contact pin 120. However, in some embodiments more than one conducting thread 140 may be coupled with a contact hole 126 of a contact pin 120. Embodiments are not limited in this manner.

In some embodiments, the housing 110 may form a substantially circular shape 110, as illustrated in FIG. 1A. However, embodiments are not limited in this manner and the housing 110 may have other shapes, such as rectangle, oval, and so forth. In some embodiments, the shape of the housing may be used to align the pins with pads, or vice versa. For example an oval shape may be used for alignment, but embodiments are not limited in this manner. Other shapes and may contemplated and based on the primary function of the device, e.g. a button. Further the housing 110 may be formed by the outer shell 112 and inner shell 114 which may be coupled or adhered to each other via a fixing mechanism, such as an adhesive, a weld, a mechanical coupling, and so forth. For example, the outer shell 112 and inner shell 114 may be adhered to each other using glue or epoxy to form the housing 110. In another example, the outer shell 112 and inner shell 114 may be mechanically coupled by inserting the inner shell 114 into the outer shell 116 and securing them together via a fastener such as a clip or via a lip of the outer shell 116 itself. Embodiments are not limited in this manner.

In embodiments, the outer shell 112 may be made of a plastic material, such as polyethylene terephthalate, high density polyethylene, polyvinyl chloride, low density polyethylene, polypropylene, acrylic resin, bakelite, catalin, celluloid, galalith, lucite, melamine formaldehyde, phenolic resin, urea-formaldehyde, and so forth. Embodiments are not limited in this manner. The outer shell 112 may form the base 118 of the housing 110 which may include one or more attachment mechanisms to secure the device 100 to a wearable object, for example. In some embodiments the outer shell 112 may function as a housing insulator and strain relief to minimize strain on the female/male plug.

The inner shell 114 may be made of a metal or metal alloy material, such as brass, aluminum, steel, copper, stainless steel, titanium, galvanized steel, nickel, nickel silver, iron, and so forth. Embodiments are not limited to these examples. The inner shell 114 may provide electromagnetic interference (EMI) and radio interference (RFI) shielding. In some embodiments, the metal used for the inner shell 114 may be based on its EMI/RFI shielding properties. Embodiments are not limited in this manner.

As previously mentioned, the inner shell 114 may be coupled and secured to the outer shell 112. Further, the inner shell 114 and outer shell 112 may extend outwardly away from the base 118 at the outer edge of the housing 110 to form a lip or extended portion. The extended portion of the inner shell 114 may include a retention track 116 to physically engage a counterpart retention track of a male plug, for example. The retention track 116 may function to retain the male plug with the female plug in a secure manner.

In embodiments, the PCB 135 may include the socket 130, the contact pins 120, the contact holes 126, and the retention bumps 124. The PCB 135 may be secured within the housing 110. More specifically, the PCB 135 may be secured to the inner shell 114 of the housing 110 via any type of fastening device, such as a screw, bolt, adhesive, and so forth. In some embodiments, the PCB 135 may be secured directly to the inner shell 114 or physically away from the inner shell 114 using one or more standoffs.

As previously mentioned, there may be 22 contact pins 120-1 through 120-22, which may include a first set of two high speed differential transmit pair and two high speed differential receive pair, and a second set of two high speed differential transmit pair and two high speed differential receive pair. The contact pins 120 may also include a low speed differential pair, two control channel pins, and two sideband signal pins. The control pins 120 along with a ground terminal and a $V_{bus}$ terminal of the socket 130 may form a 24-pin configuration and operate in accordance with the USB Specification. In some embodiments, the socket 130 may include a substantially circular shape portion and two relatively larger oval shaped portions to provide the ground terminal. Further, the socket 130 may include four relatively smaller oval shaped portions (relative to the larger oval shaped portions) to provide a power terminal. In embodiments, the ground terminal and the power terminal may be electrically isolated from each other.

The contact pins 120 may be made of a conductive material, such as metal or metal allow material to enable electrical conductivity. For example, the contact pins 120 may be a copper trace on the PCB 135. Similarly, the retention bumps 124 and the contact holes 126 may also be made of a conductive material, such as a metal or metal allow. The retention bumps 124 may extend away from the surface of the PCB 135 and associated contact pin 120 to physically engage contact pads of a male plug under spring-like tension. For example, a retention bump 124 may include an elbow extended away from the contact pin 120 and surface of the PCB 135. Further, the retention bump 124 may flexibly bend toward the contact pin 120 when a contact pad engages it. Embodiments are not limited in this manner and the retention bump 124 may be configured in a different manner to enable spring-like tension when contacting a contact pad.

The contact holes 126 may be a conductive hole or via through the PCB 135 that enables electrical coupling of the contact pins 120 with the conducting threads 140. For example, each contact pin 120 may have a contact hole 126 towards an outer edge of the housing 110 that forms a via through the PCB 135 that is coupled and/or physically attached with a conducting thread 140 that may be coupled with other components, for example. The conductive threads 140 may be fabric that is capable of conducting electricity. For example, the conductive threads 140 may be made with metal strands woven into a construction of a textile, such as a cotton fiber. In some embodiments, the textiles may be impregnated with carbon or metal based powders to allow for electrical conductivity. The conductive threads 140 may be woven into and make up a portion of a shirt, for example, and allow for an electrical coupling with other components that may be embedded or part of the shirt. Embodiments are not limited in this manner.

FIG. 1B illustrates an example device 150. In some embodiments, as shown in FIG. 1B, device 150 may be a male plug of an interface component capable of engaging a female plug, such as device 100 discussed above in FIG. 1A. The device 150 may include a number of features to enable I/O communication of information between systems and devices. For example, the device 150 may include a housing 160 that further includes an outer shell 152, inner shell 154, a retention track 156, a body 158, and a handle 190. The device 150 may include a stud 180 and contact pads 170-*t*, where t may be any positive integer. As will be discussed in more detail below, the device 150 may include a processing system having one or more components. The processing system may be coupled with the contact pads 170 enabling the processing system to electrically couple with other components via a female plug communicate data via signals.

In some embodiments, the housing 160 may form a substantially circular shape, as illustrated in FIG. 1B. However, embodiments are not limited in this manner and the housing 160 may have other shapes, such as rectangle, oval, and so forth. The housing 160 may be formed by the outer shell 152 and inner shell 154 which may be coupled or adhered to each other via a fixing mechanism, such as an adhesive, a weld, a mechanical coupling, and so forth. For example, the outer shell 152 and inner shell 154 may be adhered to each other using glue or epoxy to form the housing 160. In another example, the outer shell 152 and inner shell 154 may be mechanically coupled by inserting the inner shell 154 into the outer shell 152 and securing them together via a fastener such as a clip or via a lip of the outer shell 152 itself. Embodiments are not limited in this manner.

In embodiments, the outer shell 152 may be made of a plastic material, such as polyethylene terephthalate, high density polyethylene, polyvinyl chloride, low density polyethylene, polypropylene, acrylic resin, bakelite, catalin, celluloid, galalith, lucite, melamine formaldehyde, phenolic resin, urea-formaldehyde, and so forth. Embodiments are not limited in this manner. The outer shell 152 may form the body 158 of the housing 160 which may be capable of housing a processing system, for example. In some embodiments the outer shell 152 may function as a housing insulator and strain relief to minimize strain on the female/male plugs.

The inner shell 154 may be made of a metal or metal alloy material, such as brass, aluminum, steel, copper, stainless steel, titanium, galvanized steel, nickel, nickel silver, iron, and so forth. Embodiments are not limited to these examples. The inner shell 154 may provide electromagnetic interference (EMI) and radio interference (RFI) shielding. In some embodiments, the metal used for the inner shell 154 may be based on its EMI/RFI shielding properties. Embodiments are not limited in this manner.

As previously mentioned, the inner shell 154 may be coupled and secured to the outer shell 152. Further, the inner shell 154 and outer shell 152 may extend outwardly away from the body 158 at the outer edge of the housing 160 to form an extended portion. The extended portion of the inner shell 154 may include a retention track 156 to physically engage a counterpart retention track of a female plug, for example. The retention track 156 may function to retain the female plug with the male plug in a secure manner.

The housing 160 including the body 158 may include a handle 190 which may be a relatively thicker portion of the outer shell 152 extending outwardly in a direction away from the center of the device 150. The handle 190 may provide a surface area to enable a user to attach and detach the device 150 from another device, such as the female plug 100.

The stud 180 and the contact pads 170 may be made of electrically conductive material, such as a metal or metal alloy and are capable of physically and/or electrically engaging a socket and a contact pins, respectively. The stud 180 may include a substantially circular shape portion and two relatively larger oval shaped portions to provide a ground terminal. Further, the stud 180 may include four relatively smaller oval shaped portions (relative to the larger oval shaped portions) to provide a power terminal. Further, the ground terminal and the power terminal may be electrically isolated from each other. The stud 180 may be raised and capable of physically engage an indented portion of a socket of a female plug. In embodiments, the stud 180 may extended outwardly relatively further than the contact pads to ensure that the power and ground terminals make contact prior to the contact pads. However, embodiments are not limited in this manner.

The contact pads 170 may each be a substantially circular shape and capable of physically engage a contact pin, and in particular, a retention bump of a contact pin. Each contact pad 170 may be capable of a physically and electrically engaging a different contact pin. However, embodiments are not limited in this manner and in some instances, two or more contact pads may physically and electrically engage a contact pin.

The stud 180 and contact pads 170 may be formed as part of a PCB 165. In some instances, the stud 180 and contact pads 170 may be placed on an underside of a PCB 165 having one or more other components to support a processing system on an opposing side. The stud 180 and contact pads 170 may be physically and electrically coupled with these components of the processing system via one or more traces and vias, for example.

In some embodiments, devices 100 and 150 may operate as a system to process and bi-directionally communicate information. For example, device 100 may be a female plug enabled to operate in accordance with a USB protocol and device 150 may be a male plug enabled to operate in accordance with the USB protocol. The male and female plug may be physically and electrically coupled to form a system to process and communicate information between each other and other components. In some embodiments, the male plug may include a processing system capable of processing information and communicating information with the female plug and other components via the female plug. In some embodiments, the devices 100/150 may couple to form a fastening button that may be used in securing of a garment. These and other details will become more apparent in the following description. Further, FIGS. 1A/1B illustrate male and female plugs configured to couple as a non-directional interface or reversible interfaces. Thus, the male plug may be coupled with the female plug without requiring a specific orientation. In some embodiments, the contact pads may be circular in shape (not shown) and therefore "auto-align" and are independent on how the coupling occurs. In another example, the device may include circuitry, a controller or module to determine which pin is coupled with which pad based on signals communicated over each of the pins/pads. Embodiments are not limited in this manner.

Figure 2A:
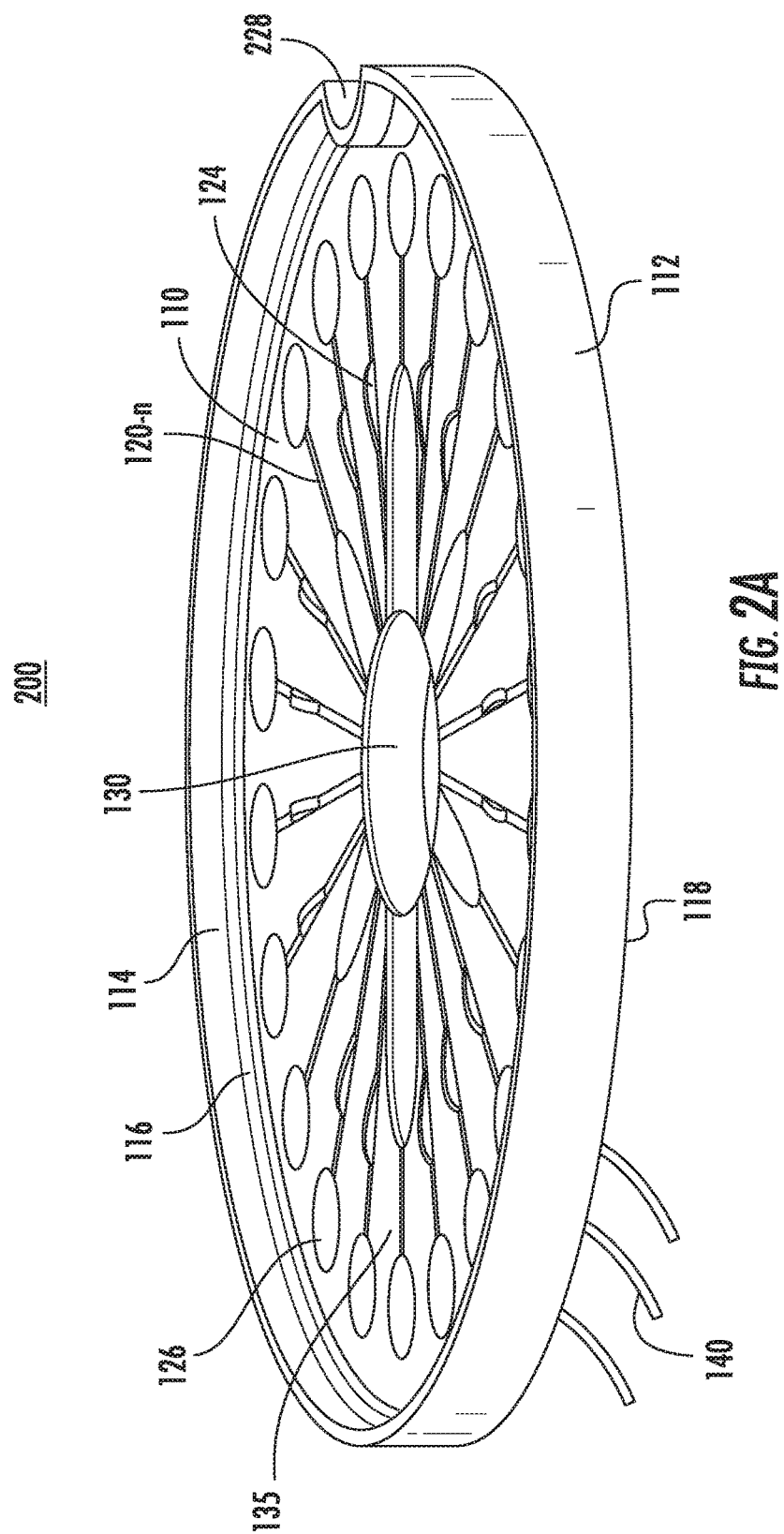
FIGS. 2A/2B illustrate an example second device.

FIGS. 2A/2B illustrate example embodiments of devices 200 and 250. In embodiments, device 200 may be a female plug as similarly discussed above in FIG. 1A, and device 250 may be male plug as similarly discussed above in FIG. 1B. However, in the illustrated embodiment, the device 200 may include notch 228 and device 250 may include notch 262. Thus, devices 200 and 250 may couple with other uni-directionally to ensure that particular pads align with particular pins.

As illustrated in FIG. 2A, notch 228 may be an indentation on the extended portion of the outer shell 112 and the inner shell 114. In other words, the notch 228 may protrude inwardly towards the center of the device 200. However, embodiments are not limited in this manner and the notch 228 may extend outwardly (not shown) in other embodiments.

Figure 2B:
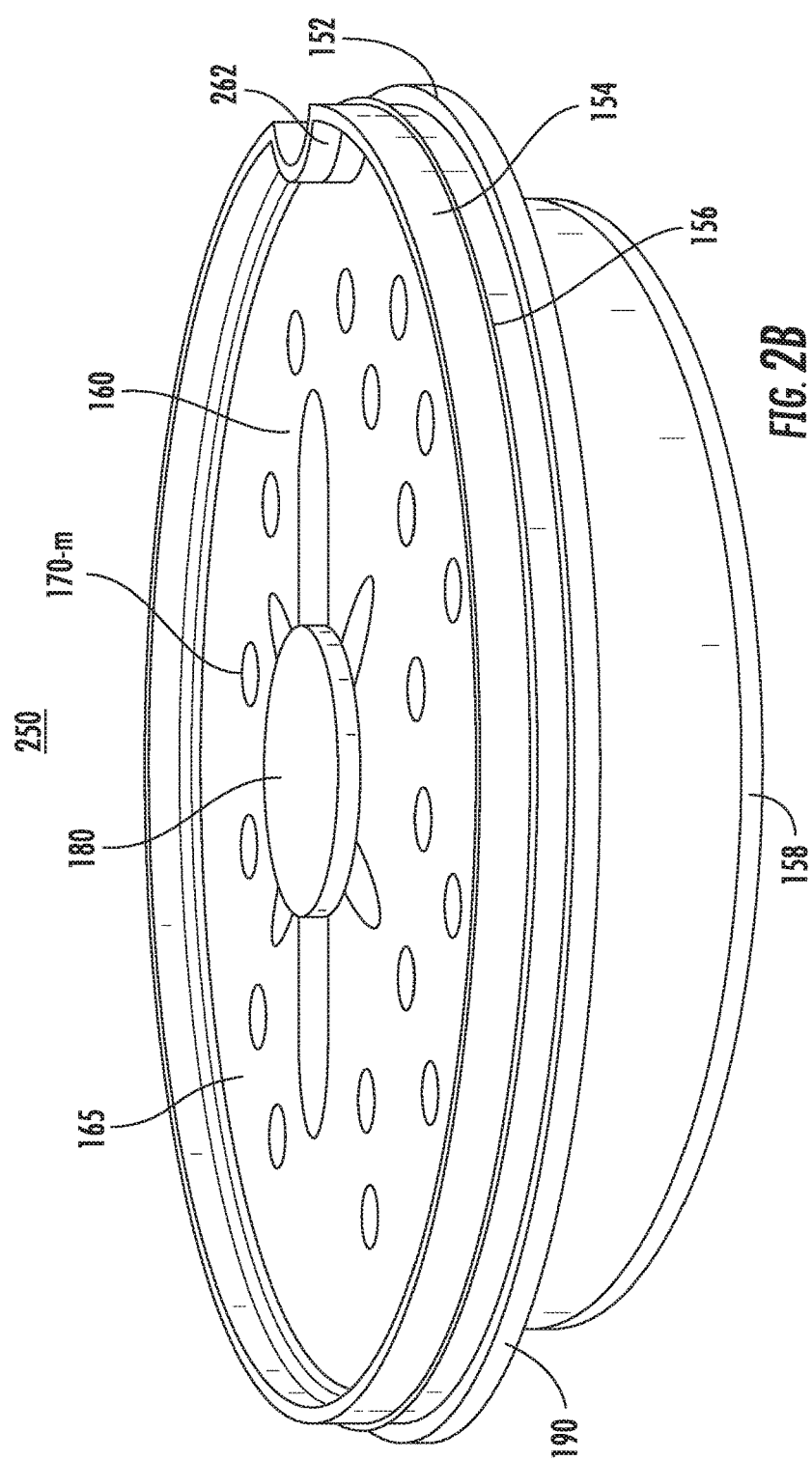

Similarly FIG. 2B illustrates notch 262 as an indentation on the extended portion of the outer shell 152 and the inner shell 154. Notch 262 may also protrude inwardly towards the center of the device 250. Embodiments are not limited in this manner.

Figure 3A:
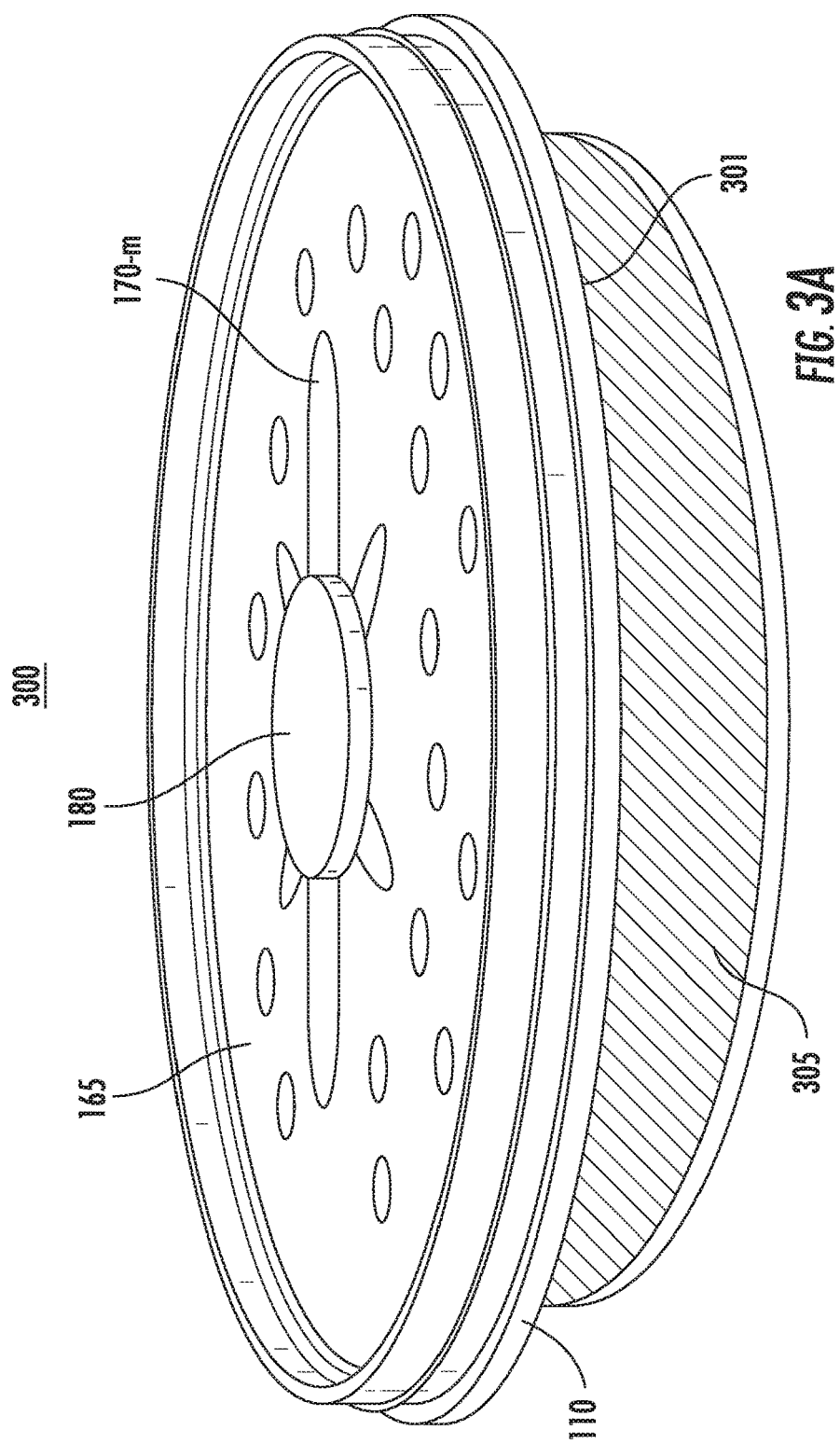
FIG. 3A/3B illustrates an example third device.

FIGS. 3A/3B illustrates an example embodiment a device 300 including a processing system 301. The device 300 may be the same as device 150 and 250 previously discussed above. More specifically, the device 300 may be a male plug capable of physically and electrically engaging a female plug, such as device 100 and device 200.

In the illustrated embodiment, the processing system 301 may be located within a cavity 302 of the housing 110 of the device 300. In other words, the body 158 may be formed in such manner to create a cavity 302 in which the processing system 301 may reside. As previously mentioned, the processing system 301 may include one or more components located on and/or coupled with the PCB 165. Thus, the components of the processing system 301 may be coupled with the contact pads 170. For example, one or more traces on the PCB 165 may couple each of the contact pads 170 with the components of the processing system 301. The traces may couple with processing system 301 components with the contact pads 170 through vias in the PCB 165, for example.

Figure 3B:
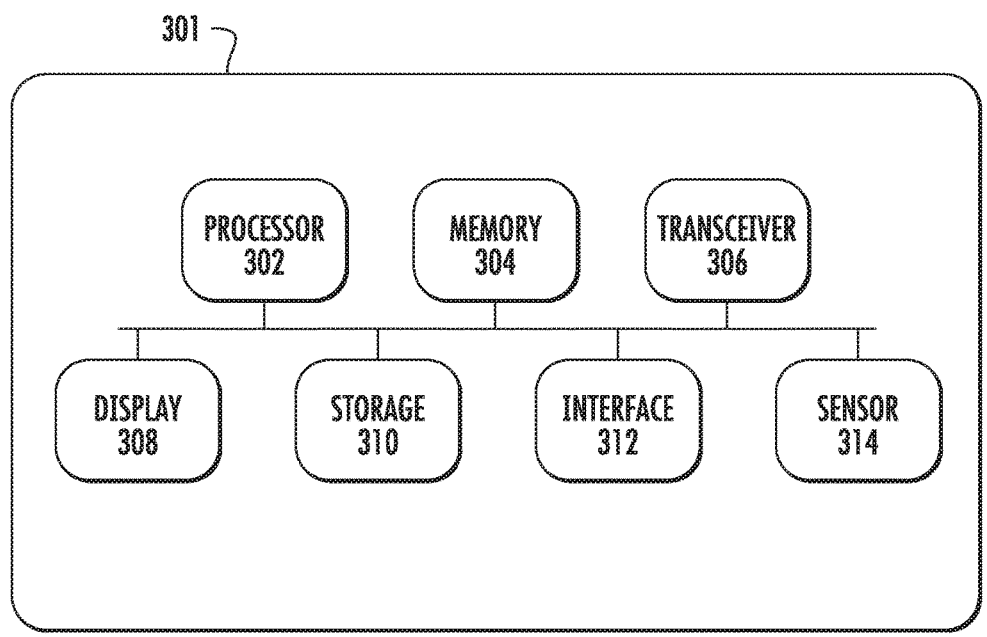

FIG. 3B illustrates an example of processing system 301 including a number components such as a processor 302, a memory 304, a transceiver 306, a display 308, a storage 310, an interface 312, and a sensor 314.

The system may include the processor 302 which may be one or more of any type of computational element, such as but not limited to, a microprocessor, a processor, central processing unit, digital signal processing unit, dual core processor, mobile device processor, desktop processor, single core processor, a system-on-chip (SoC) device, complex instruction set computing (CISC) microprocessor, a reduced instruction set (RISC) microprocessor, a very long instruction word (VLIW) microprocessor, or any other type of processor or processing circuit on a single chip or integrated circuit. In various embodiments, system 301 may include more than one processor.

In one embodiment, system 301 may include a memory 304 to couple to processor 302. Memory 304 may be coupled to processor 302 via an interconnect, or by a dedicated communications bus between processor 302 and memory 304, which may vary as desired for a given implementation. Memory unit 304 may be implemented using any machine-readable or computer-readable media capable of storing data, including both volatile and non-volatile memory. In some embodiments, the machine-readable or computer-readable medium may include a non-transitory computer-readable storage medium, for example. The embodiments are not limited in this context.

The memory 304 may store data momentarily, temporarily, or permanently. The memory 304 may store instructions and data for system 301. The memory 304 may also store temporary variables or other intermediate information while the processor 302 is executing instructions. The memory 304 is not limited to storing the above discussed data; the memory 304 may store any type of data.

In some embodiments, the processing system 301 includes a transceiver 306 which includes one or more components and circuitry to transmit and receive information using radio-frequency signals. More specifically, the transceiver 306 may include circuitry to produce radio-frequency mobile radio signals which are to be sent and for processing radio-frequency mobile radio signals which have been received. To this end, the transceiver 306 may be coupled to one or more antennas (not shown). The transmitted or received mobile radio signals are in one or more particular frequency ranges, which are typically prescribed by the mobile radio standard(s) supported by the radio-frequency assemblies. The transceiver 306 can include circuitry to process information according to one or more IEEE standards, one or more peer-to-peer protocols, and so forth. For example, the transceiver 306 may be capable of communicate data in the 60 GHz frequency range in accordance with the IEEE 802.11ad standard. In some embodiments, the transceiver 306 may operate using one or more of Bluetooth® protocols and near field communication (NFC) protocols. Embodiments are not limited in this manner.

The processing system 301 may also include a display 308. The display 308 may constitute any display device capable of displaying information received from processor 302, such as liquid crystal display (LCD), cathode ray tube (CRT) display, a projector, and so forth. Various embodiments are not limited in this manner. In some embodiments, the display 308 may be flexible display, such as an OLED display.

The processing system 301 may include storage 310. Storage 310 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 310 may include technology to increase the storage performance enhanced protection for valuable digital media when multiple hard drives are included, for example. Embodiments are not limited in this manner.

In embodiments, the processing system 301 may include one or more interfaces 312 that may include Universal Serial Bus (USB) ports/adapters, IEEE 1394 Firewire ports/adapters, and so forth. The embodiments are not limited in this context.

The processing system 301 may also include one or more sensors 314, such as an input sensor, a biometric sensor, a camera sensor, an infrared sensor, a global position system (GPS) sensor, an orientation sensor, an accelerator, a thermal sensor, an optical sensor, a heart-rate monitor sensor, a MEMS sensor, a compass, a microphone, piezoelectric sensors, thermometer, a magentostrictive sensor, a radiation sensor, a proximity sensor, an inertial sensor, a weight sensor, a pressure sensor, a touch-input sensor, and so forth. Embodiments are not limited to these examples. A sensor may be any type of computer component to detect events and/or changes in its environment and provide a corresponding output.

Although FIG. 3B illustrates a limited number of components, embodiments are not limited in this manner. The processing system 301 may include a number of components, circuitry, traces and so forth to enable processing and communication of information and data. In some instances, the processing system 301 may be Intel's® Atom® or Quark® system on chip (SoC) or a similar type of processing system or miniaturized SoC such as Intel's® Curie®.

FIG. 4 illustrates an example pinout 400 for a device, such as devices 100, 150, 200, 250 and 300 as previously discussed above in FIGS. 1A-3A. The pinout diagram 401 illustrates a location layout of contact pins, contact pads, a socket, and a stud. The pinout diagram 401 illustrates an embodiment having a 24-pin design similar to a USB Type-C connection. Table 403 illustrates the different signals for the pinout diagram 401 and provides a short description of the signals.

As highlighted in diagram 401 and table 403, there may be 22 data lines, which may include a first set of two high speed differential transmit pair and two high speed differential receive pair, and a second set of two high speed differential transmit pair and two high speed differential receive pair. The data lines may also include a low speed differential pair, two control channel pins, and two sideband signal pins. The data lines along with the ground terminal and the $V_{bus}$ terminal may form the 24-pin configuration and operate in accordance with the USB Specification.

Figure 5:
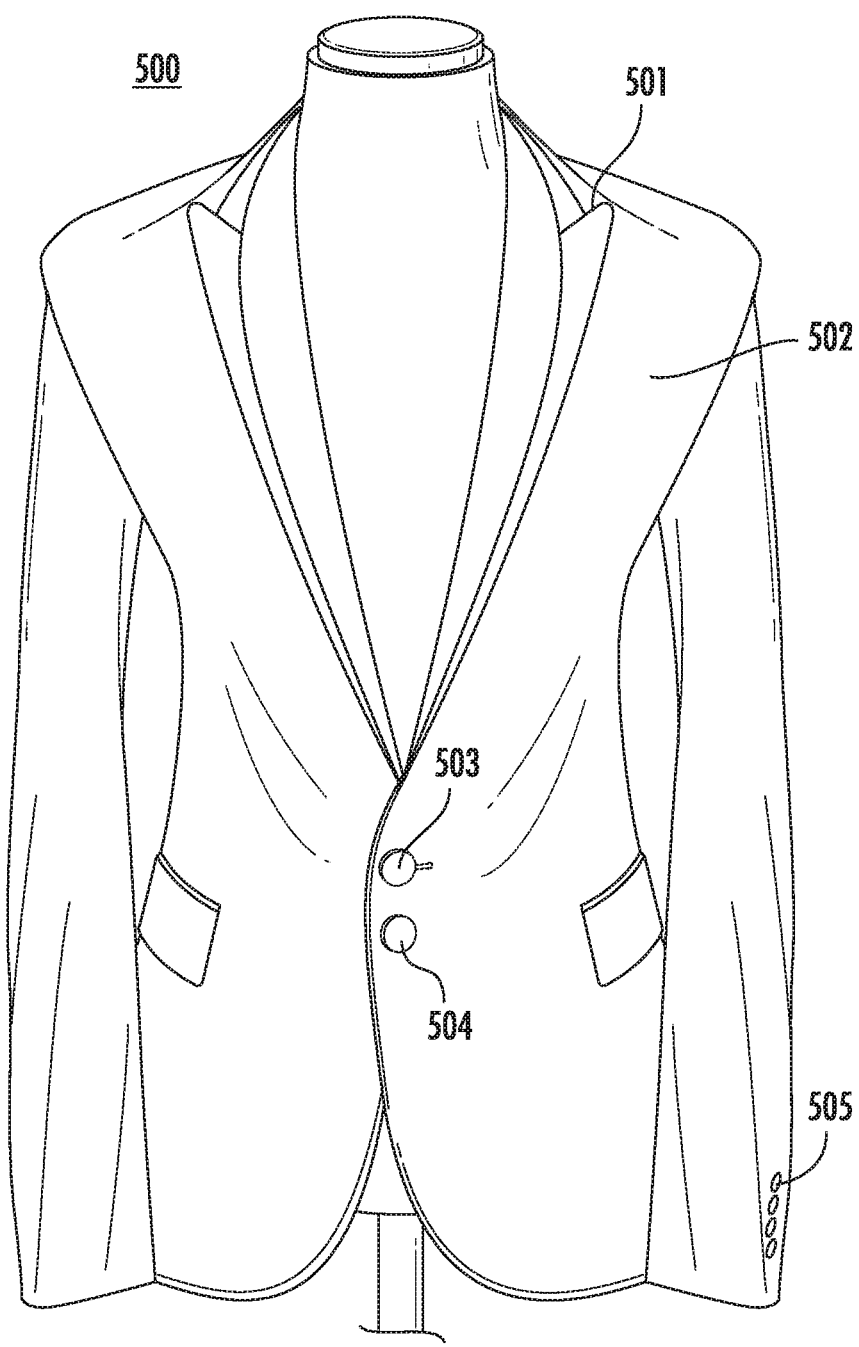
FIG. 5 illustrates an example of a first system.

FIG. 5 illustrates an example of a first system 500 which may be "smart" blazer that is capable of having a number of processing system components and interconnects to process information and data as a wearable device. These components may include the devices and systems discussed above in FIGS. 1A-4. Each component may include a pair of plugs (female/male) such as device 100 and device 150 or device 200 and device 250. In addition, a component may include a processing system, such as processing system 301 discussed in FIGS. 3A and 3B. Embodiments are not limited in this manner.

In the illustrated system 500, the smart blazer may include a touch sensor 501, a fabric interconnect 502, a computing system 503, a first I/O component 504, and a second I/O component 505. In embodiments, the touch sensor 501, computing system 503, and I/O components 504 and 505 may be electrically coupled with one another via the fabric interconnect 502. The fabric interconnect 502 may include conductive threads, similar to those previously discussed, to communicate signals between the various components. For example, the fabric interconnect 502 may include metal strands or powders enabling the fabric to communicate electrical signals and information.

The touch sensor 501 of the system 500 may enable a user to input information and data that may be processed by the computing system 503 and communicated by the I/O components 504 and 505, for example. The touch sensor 501 may be any type of input device, such as one or more sensors capable of detecting touch inputs. The touch sensor 501 may be flexible and woven into the smart blazer. For example, the touch sensor 501 may be a smart fabric touch keyboard. Embodiments are not limited in this manner.

The computing system 503 may include circuitry and components to process and communicate information and data. In some embodiments, the computing system 503 may be in one or more of the form factors as previously discussed above in FIGS. 1A-4. For example, the computing system 503 may take the form of a button or a circular device having a processing system, such as processing system 301, and a USB Type-C type interconnect as described in FIGS. 1A-3A. More specifically, the computing system 503 may include a processing system in a body of a button which may be coupled with other components of the system 500 via a circular male/female plug coupled with the fabric interconnect 502 via conductive threads, such as conductive threads 140.

The computing system 503 may communicate information between the touch sensor and I/O components 504 and 505 via the fabric interconnect 502. For example, the computing system 503 may receive inputs entered by a user via the touch sensor 501 over the fabric interconnect 502. The computing system 503 may process information based on the received inputs and communicate information with other components via the fabric interconnect 502 and I/O components 504 and 505.

The I/O components 504 and 505 may be coupled with one or more other, components, devices, and systems which may be remote to the smart blazer. In instances, I/O components 504 and 505 may include wired or wireless interfaces that are capable of communicating information. For example, one or both of the I/O components 504 and 505 may include a (male or female) micro USB port to enable other devices to couple with the smart blazer. In another example, one or both of the I/O components 504 and 505 may include a transceiver and processing circuitry to wirelessly communicate information in accordance with IEEE® 802.11, Bluethooth®, and/or NFC®.

The I/O components 504 and 505 may be in a form factor as previously discussed above in FIGS. 1A-4. For example, the I/O components 504 and 505 may include a processing system 301, as discussed in above in FIGS. 3A and 3B. Further, the I/O components 504 and 505 may have a substantial circular shape and take the form of a button for the smart blazer. In this example, an I/O component may include a micro USB connector on a body of the button to enable wired coupling with another device. Similarly, an I/O component may include a wireless transceiver in a cavity of the body of the button to enable wireless coupling with another device.

The I/O components 504 and 505 may also include a USB Type-C type connector, as discussed above in FIGS. 1A-4, to enable communication information and data with other components of the system 500. Thus, data and information sent and received by the I/O components 504 and 505 may be communicated with the computing system 503 and touch sensor 501 via the fabric interconnect 502 coupled with fabric threads of the I/O components 504 and 505, for example. Embodiments are not limited in this manner.

Figure 6:
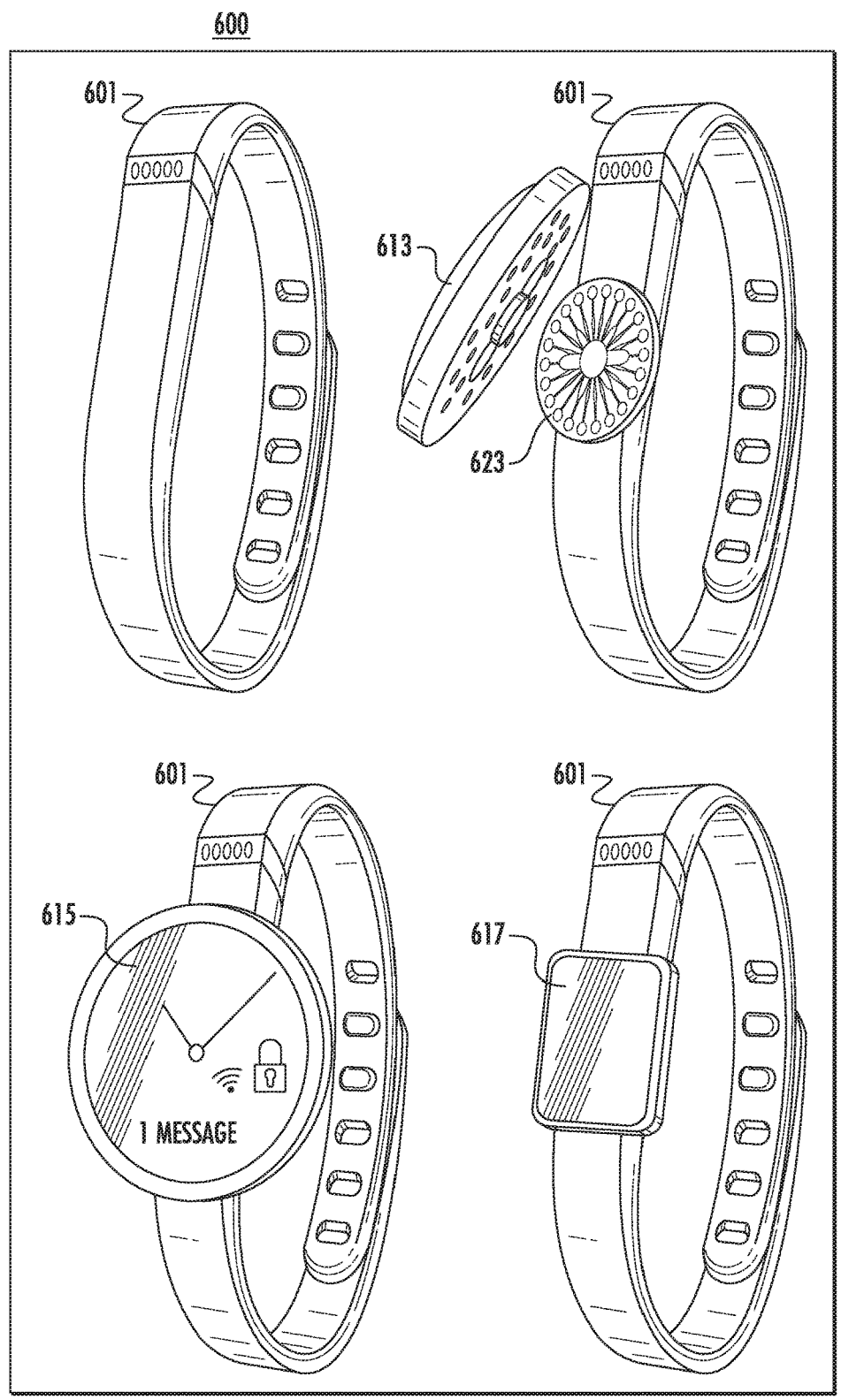
FIG. 6 illustrates an example of a second system.

FIG. 6 illustrates an example second system 600 which may include a smart wristband 601 that is capable of performing a number of operations and functions including fitness tracking, smart watch, portable wireless device, and portable memory/storage device. For example, the smart wristband 601 may include a device, such as a female plug that is capable of accepting a male plug, as previously discussed above. The smart wristband 601 may enable male plugs including different processing capabilities to interchangeably couple with the female plug to provide the different processing capabilities.

In FIG. 6, smart wristband 601 may be a typical wristband device that is capable of performing a number of different functions including fitness tracking, heart-rate monitoring, sleep monitoring, and so forth. In some embodiments, the smart wristband 601 may include a female plug 623 that is capable of accepting a male plug 613 to provide additional functionality. For example, the wireless device 613 may include a processing system, such as processing system 301, which includes wireless communication capabilities to communicate in a wireless wide area network (WWAN). For example, the wireless device 613 may include a transceiver capable of communicating using Long-Term Evolution (LTE) and Worldwide Interoperability for Microwave Access (WiMAX) techniques. The processing system of the wireless device 613 may enable information collected by the smart wristband 601 to be communicated wirelessly to other, remote devices.

The smart wristband 601 including the female plug 623 may also couple with a male plug of smart watch device 615 having a display and smart watch capabilities. For example, the smart watch device 615 may be able to display time and information collected by the smart wristband 601. The smart watch device 615 may also include circuitry, such as a transceiver, to communicate information such as text messages, emails, sms messages, and so forth that may be displayed on the display of the smart watch device 615. Embodiments are not limited in this manner.

In another example, the smart wristband 601 including the female plug 623 may also couple with a male plug of a storage device 617 having portable memory or storage device capabilities. The storage device 617 may receive and storage information and that data may be transferred to another device. For example, the storage device 617 may store fitness tracking information that may be transferred to computing device via the storage device 617. Embodiments are not limited in this manner.

Figure 7:
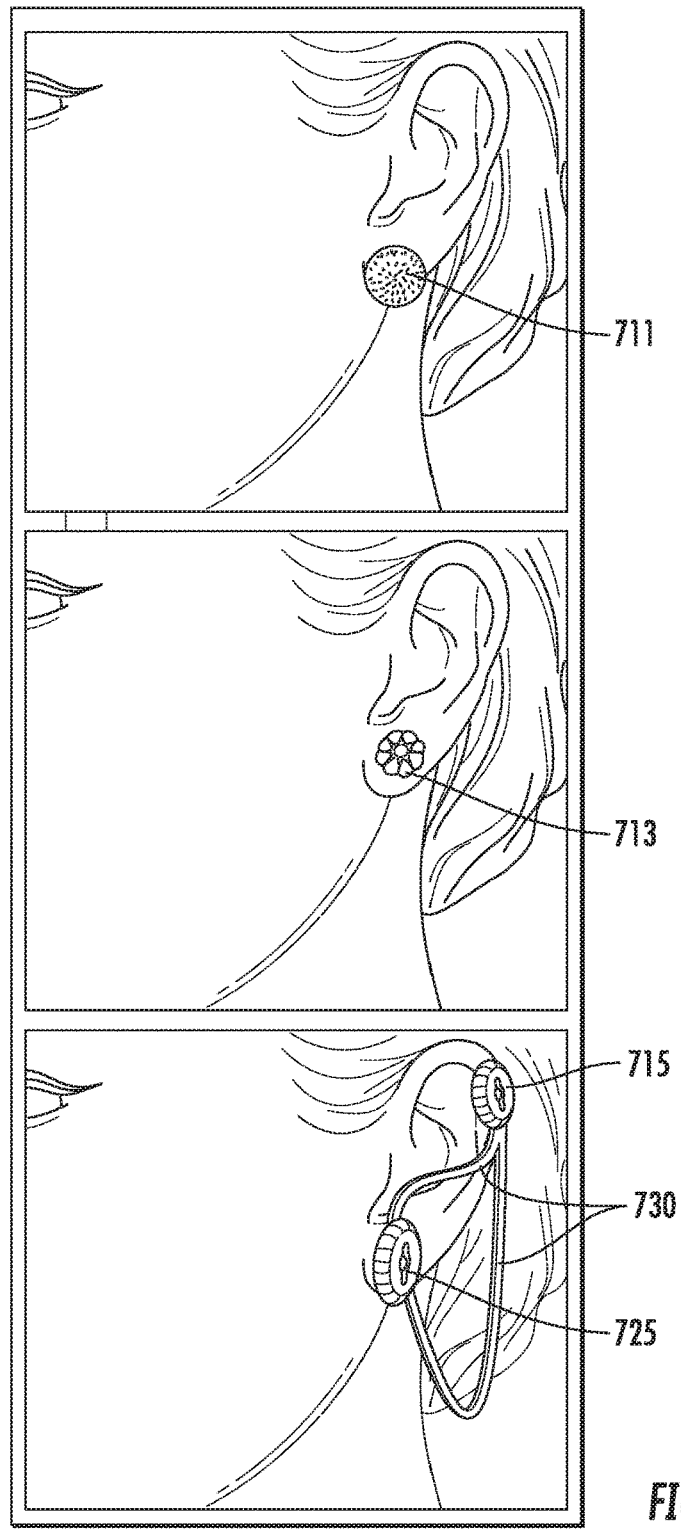
FIG. 7 illustrates an example of a third system.

FIG. 7 illustrates an example third system 700 which may include a smart wearable device, such as an earring that is capable of providing processing functionality. The earrings 711, 713, 715, and 725 may include a processing system, such as processing system 301, and have a male/female plug, as discussed in FIGS. 1A-4.

The earrings 711, 713, 715, and 725 can include any number of components and circuitry to perform different functions. For example, an earring may include a sensor to detect movement and operate as a fitness tracker. Further, the earring may include circuitry to wireless communicate the information to other devices. In a third example, an earring may include a camera module capable of capturing images and video. In a fourth example, two or more earrings may be coupled with one another via a wired or wireless interconnect to communicate information between each other. Embodiments are not limited to these examples.

Figure 8:
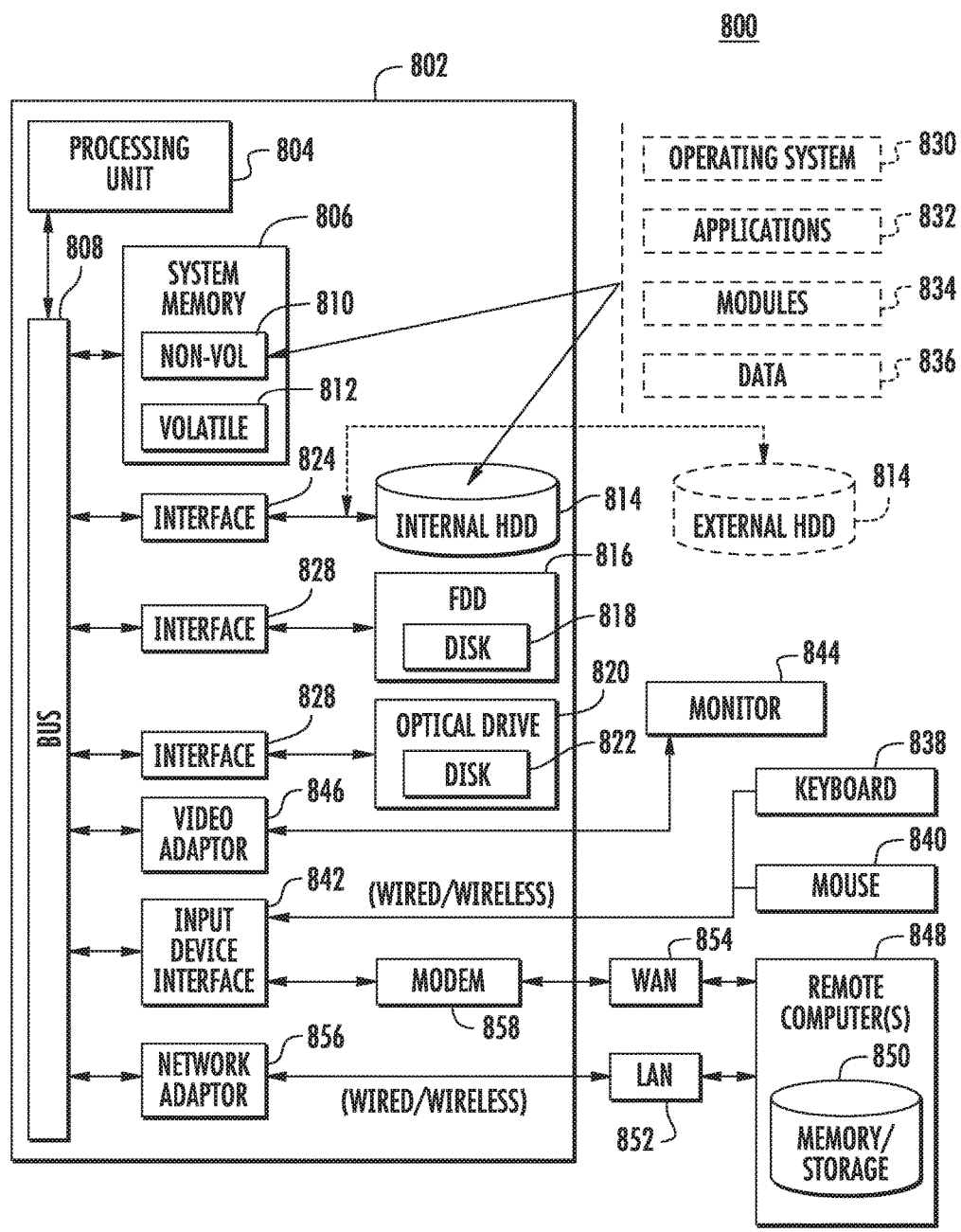
FIG. 8 illustrates an example computing architecture.

FIG. 8 illustrates an embodiment of an exemplary computing architecture 800 suitable for implementing various embodiments as previously described. In one embodiment, the computing architecture 800 may comprise or be implemented as part of any of the above described devices and systems.

As used in this application, the terms "system" and "component" are intended to refer to a computer-related entity, either hardware, a combination of hardware and software, software, or software in execution, examples of which are provided by the exemplary computing architecture 800. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 800 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 800.

As shown in FIG. 8, the computing architecture 800 comprises a processing unit 804, a system memory 806 and a system bus 808. The processing unit 804 can be any of various commercially available processors, such as those described with reference to the processor 302 shown in FIG. 3B.

The system bus 808 provides an interface for system components including, but not limited to, the system memory 806 to the processing unit 804. The system bus 808 can be any of several types of bus structure that may further interconnect to a memory bus (with or without a memory controller), a peripheral bus, and a local bus using any of a variety of commercially available bus architectures. Interface adapters may connect to the system bus 808 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 800 may comprise or implement various articles of manufacture. An article of manufacture may comprise a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 806 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 8, the system memory 806 can include non-volatile memory 810 and/or volatile memory 812. A basic input/output system (BIOS) can be stored in the non-volatile memory 810.

The computer 802 may include various types of computer-readable storage media in the form of one or more lower speed memory units, including an internal (or external) hard disk drive (HDD) 814, a magnetic floppy disk drive (FDD) 816 to read from or write to a removable magnetic disk 818, and an optical disk drive 820 to read from or write to a removable optical disk 822 (e.g., a CD-ROM or DVD). The HDD 814, FDD 816 and optical disk drive 820 can be connected to the system bus 808 by a HDD interface 824, an FDD interface 826 and an optical drive interface 828, respectively. The HDD interface 824 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 810, 812, including an operating system 830, one or more application programs 832, other program modules 834, and program data 836. In one embodiment, the one or more application programs 832, other program modules 834, and program data 836 can include, for example, the various applications and/or components of the system 105.

A user can enter commands and information into the computer 802 through one or more wired/wireless input devices, for example, a keyboard 838 and a pointing device, such as a mouse 840. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 804 through an input device interface 842 that is coupled to the system bus 808, but can be connected by other interfaces such as a parallel port, IEEE 1394 serial port, a game port, a USB port, an IR interface, and so forth.

A monitor 844 or other type of display device is also connected to the system bus 808 via an interface, such as a video adaptor 846. The monitor 844 may be internal or external to the computer 802. In addition to the monitor 844, a computer typically includes other peripheral output devices, such as speakers, printers, and so forth.

The computer 802 may operate in a networked environment using logical connections via wired and/or wireless communications to one or more remote computers, such as a remote computer 848. The remote computer 848 can be a workstation, a server computer, a router, a personal computer, portable computer, microprocessor-based entertainment appliance, a peer device or other common network node, and typically includes many or all of the elements described relative to the computer 802, although, for purposes of brevity, only a memory/storage device 850 is illustrated. The logical connections depicted include wired/wireless connectivity to a local area network (LAN) 852 and/or larger networks, for example, a wide area network (WAN) 854. Such LAN and WAN networking environments are commonplace in offices and companies, and facilitate enterprise-wide computer networks, such as intranets, all of which may connect to a global communications network, for example, the Internet.

When used in a LAN networking environment, the computer 802 is connected to the LAN 852 through a wire and/or wireless communication network interface or adaptor 856. The adaptor 856 can facilitate wire and/or wireless communications to the LAN 852, which may also include a wireless access point disposed thereon for communicating with the wireless functionality of the adaptor 856.

When used in a WAN networking environment, the computer 802 can include a modem 858, or is connected to a communications server on the WAN 854, or has other means for establishing communications over the WAN 854, such as by way of the Internet. The modem 858, which can be internal or external and a wire and/or wireless device, connects to the system bus 808 via the input device interface 842. In a networked environment, program modules depicted relative to the computer 802, or portions thereof, can be stored in the remote memory/storage device 850. It will be appreciated that the network connections shown are exemplary and other means of establishing a communications link between the computers can be used.

The computer 802 is operable to communicate with wire and wireless devices or entities using the IEEE 802 family of standards, such as wireless devices operatively disposed in wireless communication (e.g., IEEE 802.11 over-the-air modulation techniques). This includes at least WiFi (or Wireless Fidelity), WiMax, and Bluetooth™ wireless technologies, 3G, 4G, LTE wireless technologies, among others. Thus, the communication can be a predefined structure as with a conventional network or simply an ad hoc communication between at least two devices. WiFi networks use radio technologies called IEEE 802.11x (a, b, g, n, etc.) to provide secure, reliable, fast wireless connectivity. A WiFi network can be used to connect computers to each other, to the Internet, and to wire networks (which use IEEE 802.3-related media and functions).

The various elements of the computing system 101 and 200 as previously described with reference to FIGS. 1-8 may comprise various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The detailed disclosure now turns to providing examples that pertain to further embodiments. Examples one through twenty-five (1-25) provided below are intended to be exemplary and non-limiting.

In a first example, a system, device, apparatus may include a housing comprising a first shell portion and a second shell portion, the first shell portion forming an extended portion for the housing and comprising a retention track to engage with a counterpart retention track and a printed circuit board disposed within the housing, the printed circuit board comprising a plurality of contact pins each comprising a contact hole and a retention bump and a socket to couple with a stud.

In a second example and in furtherance of the first example, a system, device, apparatus may include a plurality of conducting threads each coupled with a corresponding one of the contact pins via one of the contact holes.

In a third example and in furtherance of any previous example, a system, device, apparatus may include each retention bump to physically engage one or more contact pads under spring-like tension.

In a fourth example and in furtherance of any previous example, a system, device, apparatus may include the first shell portion comprising a metal material and the second shell portion comprising a plastic material, the first shell portion to reduce electromagnetic interference and the second shell portion to electrically insulate electronic components.

In a fifth example and in furtherance of any previous example, a system, device, apparatus may include the first shell portion and the second shell portion comprising a notch to align with a notch of a counterpart device.

In a sixth example and in furtherance of any previous example, a system, device, apparatus may include the socket comprising a substantially circular shape portion and two relatively larger oval shaped portions to provide a ground terminal, and four relatively smaller oval shaped portions to provide a power terminal, the ground terminal and the power terminal electrically isolated from each other.

In a seventh example and in furtherance of any previous example, a system, device, apparatus may include the housing comprising a center portion and an edge portion forming a substantially circular shape, the socket located in the center portion of the housing and each contact pin extending outwardly from the socket towards the edge portion to form a radial pattern.

In an eighth example and in furtherance of any previous example, a system, device, apparatus may include the plurality of contact pins configured to provide universal serial bus (USB) Type-C functionality.

In a ninth example and in furtherance of any previous example, a system, device, apparatus may include the housing to form a base of a fastening button.

In a tenth example and in furtherance of any previous example, a system, device, apparatus may include a housing comprising a first shell portion and a second shell portion, the first shell portion forming an extended portion for the housing and comprising a retention track to engage a counterpart retention track, and a printed circuit board disposed within the housing, the printed circuit board comprising a plurality of contact pads each to physically engage a retention bump structure under spring-like tension, and a stud to couple with a socket and extended away from the housing.

In an eleventh example and in furtherance of any previous example, a system, device, apparatus may include the contact pads to enable electrical coupling with a plurality of conducting threads via the retention bump structures and contact holes of a contact pin.

In a twelfth example and in furtherance of any previous example, a system, device, apparatus may include the first shell portion comprising a metal material and the second shell portion comprising a plastic material, the first shell portion to reduce electromagnetic interference and the second shell portion to electrically insulate electronic components.

In a thirteenth example and in furtherance of any previous example, a system, device, apparatus may include the first shell portion and the second shell portion comprising a notch to align with a notch of a counterpart device.

In a fourteenth example and in furtherance of any previous example, a system, device, apparatus may include the second shell portion comprising a handle portion to enable coupling and decoupling to a counterpart device.

In a fifteenth example and in furtherance of any previous example, a system, device, apparatus may include the stud comprising a substantially circular shape portion and two relatively larger oval shaped portions to provide a ground terminal, and four relatively smaller oval shaped portions to provide a power terminal, the ground terminal and the power terminal electrically isolated from each other.

In a sixteenth example and in furtherance of any previous example, a system, device, apparatus may include the housing comprising a center portion and an edge portion and forming a substantially circular shape, the stud located in the center portion of the housing and each contact pad extending outwardly from the stud towards the edge portion to form a radial pattern.

In a seventeenth example and in furtherance of any previous example, a system, device, apparatus may include a processing system disposed within a cavity of the housing, the processing system comprising a processor, memory, a transceiver, a display, and a sensor.

In a eighteenth example and in furtherance of any previous example, a system, device, apparatus may include the printed circuit board comprising the processing system, the processing system disposed on an opposite side of the printed circuit board from the plurality of contact pads and stud.

In a nineteenth example and in furtherance of any previous example, a system, device, apparatus may include the processing system electrically coupled with the plurality of contact pads and stud to enable communication of data with a remote device via contact pins and conductive threads.

In a twentieth example and in furtherance of any previous example, a system, device, apparatus may include the plurality of contact pad configured to provide universal serial bus (USB) Type-C functionality.

In a twenty-first example and in furtherance of any previous example, a system, device, apparatus may include the housing to form a body of a fastening button.

In a twenty-second example and in furtherance of any previous example, a system, device, apparatus may include a processing system comprising a processor and memory, a first housing comprising a first shell portion and a second shell portion, the second shell portion forming an extended portion for the first housing and comprising a first retention track to engage a counterpart retention track, a first printed circuit board disposed within the first housing, the first printed circuit board comprising a plurality of contact pads each to physically engage a retention bump of one of a plurality of contact pins under spring-like tension, and a stud to couple with the socket.

In a twenty-third example and in furtherance of any previous example, a system, device, apparatus may include the processing system disposed within a cavity of the first housing, the processing system comprising a transceiver, a display, and a sensor.

In a twenty-fourth example and in furtherance of any previous example, a system, device, apparatus may include a second housing comprising a third shell portion and a fourth shell portion, the fourth shell portion forming an extended portion for the second housing and comprising the counterpart retention track to engage the first retention track; and a second printed circuit board disposed within the second housing, the second printed circuit board comprising a plurality of contact pins each comprising a contact hole and a retention bump to couple with one of the plurality of contact pads, and a socket to couple with the stud;

In a twenty-fifth example and in furtherance of any previous example, a system, device, apparatus may include the first printed circuit board comprising the processing system, the processing system disposed on an opposite side of the first printed circuit board from the plurality of contact pads and stud.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. An apparatus, comprising:
  a housing comprising:
    a first shell portion comprising an extended portion and a retention track; and
    a second shell portion to couple with the first shell portion;
  a printed circuit board (PCB) disposed within the housing, the (PCB) secured by at least one of the first shell portion or the second shell portion, the PCB comprising:
    a plurality of contact pins each comprising a contact hole and a retention bump; and
    a socket to couple with a stud; and
  a plurality of conducting threads each coupled with a corresponding one of the contact pins via one of the contact holes.

2. The apparatus of claim 1, each retention bump to physically engage one or more contact pads under spring-like tension.

3. The apparatus of claim 1, the first shell portion comprising a metal material and the second shell portion comprising a plastic material, the first shell portion to reduce electromagnetic interference and the second shell portion to electrically insulate electronic components.

4. The apparatus of claim 1, the first shell portion and the second shell portion comprising a notch to align with a notch of a counterpart device.

5. The apparatus of claim 1, the socket comprising a substantially circular shape portion and two relatively larger oval shaped portions to provide a ground terminal, and four relatively smaller oval shaped portions to provide a power terminal, the ground terminal and the power terminal electrically isolated from each other.

6. The apparatus of claim 1, the housing comprising a center portion and an edge portion forming a substantially circular shape, the socket located in the center portion of the housing and each contact pin extending outwardly from the socket towards the edge portion to form a radial pattern.

7. The apparatus of claim 1, the plurality of contact pins configured to provide universal serial bus (USB) Type-C functionality.

8. The apparatus of claim 1, the housing to form a base of a fastening button.

9. An apparatus, comprising:
  a housing comprising:
    a first shell portion comprising an extended portion and a retention track; and
    a second shell portion to couple with the first shell portion; and
  a printed circuit board (PCB) disposed within the housing, the (PCB) secured by at least one of the first shell portion or the second shell portion, the PCB comprising:
    a plurality of contact pads each to physically engage a retention bump structure under spring-like tension, the contact pads to enable electrical coupling with a plurality of conducting threads via the retention bump structures and contact holes of a contact pin; and
    a stud to couple with a socket and extended away from the housing.

10. The apparatus of claim 9, the first shell portion comprising a metal material and the second shell portion comprising a plastic material, the first shell portion to reduce electromagnetic interference and the second shell portion to electrically insulate electronic components.

11. The apparatus of claim 9, the first shell portion and the second shell portion comprising a notch to align with a notch of a counterpart device.

12. The apparatus of claim 9, the second shell portion comprising a handle portion to enable coupling and decoupling to a counterpart device.

13. The apparatus of claim 9, the stud comprising a substantially circular shape portion and two relatively larger oval shaped portions to provide a ground terminal, and four relatively smaller oval shaped portions to provide a power terminal, the ground terminal and the power terminal electrically isolated from each other.

14. The apparatus of claim 9, the housing comprising a center portion and an edge portion and forming a substantially circular shape, the stud located in the center portion of the housing and each contact pad extending outwardly from the stud towards the edge portion to form a radial pattern.

15. The apparatus of claim 9, comprising:
  a processing system disposed within a cavity of the housing, the processing system comprising: a processor, memory, a transceiver, a display, and a sensor.

16. The apparatus of claim 15, the printed circuit board comprising the processing system, the processing system disposed on an opposite side of the printed circuit board from the plurality of contact pads and stud.

17. The apparatus of claim 15, the processing system electrically coupled with the plurality of contact pads and stud to enable communication of data with a remote device via contact pins and conductive threads.

18. The apparatus of claim 15, the plurality of contact pad configured to provide universal serial bus (USB) Type-C functionality.

19. The apparatus of claim 15, the housing to form a body of a fastening button.

20. A system, comprising:
a processing system comprising a processor and memory;
a first housing comprising:
 a first shell portion comprising a metal material reduce electromagnetic interference; and
 a second shell portion comprising a plastic material to electrically insulate electronic components, the second shell portion comprising an extended portion to accommodate the first housing and comprising a first retention track to engage a counterpart retention track; and
a first printed circuit board disposed within the first housing, the first printed circuit board comprising:
 a plurality of contact pads each to physically engage a retention bump of one of a plurality of contact pins under spring-like tension; and
 a stud to couple with a socket.

21. The system of claim 20, the processing system disposed within a cavity of the first housing, the processing system comprising a transceiver, a display, and a sensor.

22. The system of claim 20, comprising:
a second housing comprising:
 a third shell portion; and
 a fourth shell portion, the fourth shell portion comprising an extended portion to accommodate the second housing and comprising the counterpart retention track to engage the first retention track; and
a second printed circuit board disposed within the second housing, the second printed circuit board comprising:
 a plurality of contact pins each comprising a contact hole and a retention bump to couple with one of the plurality of contact pads, and
 a socket to couple with the stud.

23. The system of claim 22, the first printed circuit board comprising the processing system, the processing system disposed on an opposite side of the first printed circuit board from the plurality of contact pads and stud.

* * * * *